United States Patent [19]
Hains et al.

[11] 4,168,513
[45] Sep. 18, 1979

[54] REGENERATIVE DECODING OF BINARY DATA USING MINIMUM REDUNDANCY CODES

[75] Inventors: Charles M Hains, Altadena; Allen Firstenberg, Los Angeles, both of Calif.

[73] Assignee: Xerox Corporation, Stamford, Conn.

[21] Appl. No.: 832,139

[22] Filed: Sep. 12, 1977

[51] Int. Cl.² .............................................. H04N 1/00
[52] U.S. Cl. ............................ 358/261; 340/347 DD; 358/135
[58] Field of Search ................ 340/347 DD; 358/261, 358/260, 135

[56] References Cited

U.S. PATENT DOCUMENTS

| | | | |
|---|---|---|---|
| 3,560,639 | 2/1971 | Centanni | 358/261 |
| 3,813,485 | 5/1974 | Arps | 358/261 |
| 4,035,837 | 7/1977 | Starck | 358/261 |

*Primary Examiner*—Howard W. Britton
*Attorney, Agent, or Firm*—Irving Keschner

[57] ABSTRACT

Encoding and decoding between fixed and variable length binary codes to achieve data compression and decompression is performed without the necessity for storing the entire variable length minimum redundancy code format. In encoding, data is compressed by generating a minimum redundancy code of a bit length and binary value inversely proportional to the probability of an occurrence of the fixed length binary message from which the minimum redundancy binary code symbol is derived. The compressed binary symbols are transmitted or stored in serial form. In decoding, data is decompressed by sequentially generating portions of threshold binary symbols in the minimum redundancy code and comparing with corresponding portions of a received or recovered binary symbol as it is shifted through the decoder. The comparison results define the bit length and binary value of the binary symbol without the necessity for ever storing the binary symbol in its entirety. This technique of compression and decompression is especially useful for the transmission or storage of digital image data where the probability of occurrence of particular data information is predictable.

14 Claims, 11 Drawing Figures

| CHARACTER | SYMBOL INDEX | PROBABILITY TABLE (%) | SYMBOL SIZE | SYMBOL |
|---|---|---|---|---|
| SP | 0 | 40 | 1 | 0 |
| E | 1 | 25 | 2 | 10 |
| A | 2 | 11 | 4 | 1100 |
| T | 3 | 9 | 4 | 1101 |
| O | 4 | 6 | 4 | 1110 |
| D | 5 | 5 | 5 | 11110 |
| S | 6 | 3 | 6 | 111110 |
| X | 7 | 1 | 6 | 111111 |

FIG. 1

| CHARACTER | MESSAGE SIGNAL | MINIMUM REDUNDANCY BINARY SYMBOL |
|---|---|---|
| A | 000 | 1100 |
| D | 001 | 11110 |
| E | 010 | 10 |
| O | 011 | 1110 |
| S | 100 | 111110 |
| T | 101 | 1101 |
| X | 110 | 111111 |
| sp | 111 | 0 |

FIG. 2

| CHARACTER | SYMBOL INDEX | PROBABILITY TABLE (%) | SYMBOL SIZE | SYMBOL |
|---|---|---|---|---|
| sp | 0 | 40 | 1 | 0 |
| E | 1 | 25 | 2 | 10 |
| A | 2 | 11 | 4 | 1100 |
| T | 3 | 9 | 4 | 1101 |
| O | 4 | 6 | 4 | 1110 |
| D | 5 | 5 | 5 | 11110 |
| S | 6 | 3 | 6 | 111110 |
| X | 7 | 1 | 6 | 111111 |

FIG. 3A
ENCODING & DECODING ROM

| ADDRESS | SYMBOL COUNT | |
|---|---|---|
| 0 | 1 | 01 |
| 1 | 1 | 01 |
| 2 | 0 | 00 |
| 3 | 3 | 11 |
| 4 | 1 | 01 |
| 5 | 2 | 10 |

FIG. 3B
ENCODING ROM 14

| ADDRESS | SYMBOL INDEX |
|---|---|
| 0 | 2 (010) |
| 1 | 5 (101) |
| 2 | 1 (001) |
| 3 | 4 (100) |
| 4 | 6 (110) |
| 5 | 3 (011) |
| 6 | 7 (111) |
| 7 | 0 (000) |

FIG. 3C
DECODING

| ADDRESS | MESSAGE INDEX | |
|---|---|---|
| 0 | sp | 111 |
| 1 | E | 010 |
| 2 | A | 000 |
| 3 | T | 101 |
| 4 | O | 011 |
| 5 | D | 001 |
| 6 | S | 100 |
| 7 | X | 110 |

REGENERATIVE DECODING OF BINARY DATA USING MINIMUM REDUNDANCY CODES

FIELD OF THE INVENTION

The present invention relates to systems for the compression and decompression of data using variable length binary symbols.

BACKGROUND OF THE INVENTION

Data compression and decompression is a highly useful technique which finds considerable application in image facsimile transmission and storage systems. Data compression and decompression is a technique for reducing the redundant transmission of data. For example, in the reproduction of an image of printed material in which data is derived to represent the presence or absence of print within incremental areas in a rectilinear matrix, it is unnecessarily burdensome on the data processing system employed to require transmission of redundant data, such as would occur in the generation of separate signals for each incremental area in, for example, the margin of the printed page to be reproduced.

One method of data compression is the assignment of variable length binary symbols to each possible data message to be transmitted. The arrangement of these symbols where the length of each symbol is inversely proportional to the probability of the occurrence of the message it represents is termed a minimum redundancy code. That is, the most probable message may be represented by a single binary bit, the second most probable message may be represented by two binary bits, and the third fourth and fifth most probable messages may be represented by four binary bits each. The binary symbols associated with each message are called "Huffman Codes" and are described in the publication by David A. Huffman "A Method for the Construction of Minimum Redundancy Codes", Proc. I.R.E., September, 1952, Volume 40, pp. 1098-1101. A portion of a Huffman minimum redundancy code structure is set forth below in Table I.

TABLE I

| Symbol Index | Probability | Symbol Size | Symbol |
|---|---|---|---|
| 0 | .621 | 1 | 0 |
| 1 | .078 | 3 | 100 |
| 2 | .037 | 4 | 1010 |
| 3 | .033 | 5 | 10110 |
| 4 | .030 | 5 | 10111 |
| 5 | .026 | 5 | 11000 |
| 6 | .023 | 5 | 11001 |
| 7 | .019 | 5 | 11010 |
| 8 | .017 | 6 | 110110 |
| 9 | .014 | 6 | 110111 |
| . | . | . | . |
| . | . | . | . |
| . | . | . | . |
| 31 | .002 | 10 | 1111111111 |

Several characteristics of the employed minimum redundancy code formating should be noted. One feature is that minimum binary values are used to define valid codes among binary symbols of a particular code length. The maximum binary values of symbols of that code length are not valid symbols, but are instead assigned as the initial bits of binary symbols having a larger number of bit positions. More specifically, and by way of example with reference to Table I, there are two bit values having a single bit position. These values are "zero" and "one". The employed minimum redundancy code format will assign the code "zero" to the most probable message to occur, while the code "1" is not a valid binary symbol, but instead is the prefix of the symbol "100". It is fundamental in this regard that a valid binary symbol of a particular bit length cannot employ the same bit value permutation which serves as the initial bit structure or prefix of a valid binary symbol of a greater bit length.

Another feature of minimum redundancy codes is that there is a predictable number of different binary symbols of each symbol length within a minimum redundancy format containing a specified number of different binary symbols with a known probability of occurrence. That is, and with reference to Table I, in a minimum redundancy code format containing 31 different binary symbols with known probability, there is one binary symbol having a bit length of 1, there is one binary symbol having a bit length of three, there is one binary symbol having a bit length of four, and there are five binary symbols having a bit length of five. The number of valid binary symbols of each bit length within a particular minimum redundancy code format having a prescribed probability distribution is certain. However, where the probability of occurrence within a minimum redundancy code format varies, the number of binary symbols of each length may also vary. That is, for example, the code format of Table I contains no binary symbols two bits in length. However, one binary symbol two bits in length could be employed in a minimum redundancy code format having a higher probability for the occurrence of the second symbol.

Heretofore, techniques of data compression in transmission and storage applications have often avoided utilizing the existing compression capability of minimum redundancy codes because of the expense and complexity of their implementation. While the degree of compression achieved is highly variable and depends to a large extent upon the observable activity, of events to be coded, minimum redundancy code format size, the electronic components employed and other features, target compression ratios in excess of other techniques are readily achievable under most conditions.

It is an object of the present invention, therefore, to improve the degree of data compression obtainable in data transmission under comparable operating conditions and utilizing a common minimum redundancy code as contrasted with prior data compression/decompression techniques.

Yet an additional object of the invention is to effectuate data compression and decompression without the necessity for storing the entire array of binary symbols within a minimum redundancy code format. Prior art devices require large storage capacity memories, such as large ROMs to store the lengthy binary symbols associated with low probability events. This requisite storage capacity exists in prior devices despite the fact that large memory storage areas are left vacant by the higher probability binary symbols. According to present practice, binary symbols are stored in a memory storage device, such as a ROM at an addressable location or a plurality of locations. In response to a message input, the minimum redundancy binary symbols are accessed out of the ROM. Either an excessively large ROM is required to access out the long binary symbols in a single parallel output, or recirculating techniques are required to access out a single binary symbol in response to a message input. In either event inordinately large data storage capacity is required.

The present invention obviates the entire binary symbol storage problem, however, by eliminating the necessity for storing the minimum redundancy binary symbols. Instead, the present invention takes advantage of the fact that no valid binary symbol can employ the bit permutation of a shorter valid binary symbol as a prefix. It is thereby possible to store the required symbol lengths and to regenerate each symbol as it is required for use rather than to store the entire variable length code ensemble. This regenerative technique is especially powerful in decoding where table or ROM addressing by symbol would require storing a table with data in only one out of every thirty two locations with respect to the smallest symbol in the case of the minimum redundancy code of Table I.

One prior proposed system for minimum redundancy code processing of an array of 69 variable length message requires read-only memory storage for a two level code ensemble with the necessary bit length of the maximum length symbol. This requires a 69 by 10 ROM, a size table (69 by 4 bit ROM), a threshold table for each size against the maximum length (20 by 10 bit ROM), and a translation table (69 by 5 bit ROM). For the same code ensemble, the system of the present invention requires read only memory storage for only the count of symbols for each size (20 by 4 bit ROM), and a two way translation table (138 by 5 bit ROM). In addition the aforesaid prior proposed system requires internal registers to be of the maximum symbol length of 10 bits. The present invention, on the other hand, requires only four and five bit internal registers.

In the foregoing prior proposed method of encoding minimum redundancy codes, a 10 bit shift register and a four bit size register are required to encode the required minimum redundancy bit format of Table I. The shift register is loaded with the desired symbol followed by zero bits to fill out the register. The size register is loaded with the symbol length, both values being obtained from ROM storage. The symbol is then shifted out one bit at a time from the shift register while the size register is decremented. The process is continued until the size register becomes zero, resulting in the transmission of the appropriate length symbol. A corresponding proposed decoding technique recognizes the presence of a minimum redundancy code in a particular size symbol only when the binary code representation of the symbol is smaller than the stored binary encoded threshold value of minimum redundancy codes of that symbol size. That is, with reference to Table I, if the binary symbol is five bits in length the designation "10110" is stored along with a number indicative of the relative value of the specific symbol of that symbol size which is the symbol to be identified. Again with reference to Table I, the prior proposed technique for storing the symbol of index number "6" would require binary storage of the threshold value of minimum redundancy codes of five bits in length, i.e. the value "10110" along with associated storage of the number "100" which denotes that the identified symbol is the fourth sequential one of those symbols which are five bits in length. Symbols of size 1 and 2 bits beginning with zero are decoded by separate circuitry. Symbols beginning with a 1 are shifted bit by bit through a 10 bit shift register. A subtraction of the shift register contents from the threshold is made following each shift. If the subtraction result is positive, a run length is decoded.

The shift register is reset after decoding. If a negative number results, the shift procedure continues.

The present invention represents a vast improvement over this prior operation. The present invention recognizes that the threshold minimum redundancy code values for each binary symbol length can be regenerated even if only the symbol size count is stored instead of the symbol size threshold code value. This involves storage of much smaller binary numbers. Storage of the symbol size count in lieu of the symbol size threshold value is possible only when one realizes that the size threshold value can be regenerated within the confines of a register containing only a small portion of the binary size threshold value. The sequential regeneration of threshold values corresponding to symbols of increasing size can be performed within the confines of shift register of size $\log_2 n$ bits where n is the total number of messages. The carry function performed by the addition of bits to the least significant bit position of such a register will in no way even affect the value of bits already shifted out of the register. However, for the employed minimum redundancy code formating, any effect of the carry function will occur within the least significant $\log_2 n$ bit positions, so that bits of a binary symbol threshold preceding the $\log_2 n$ least significant bit positions will never be altered.

A further object of the invention is a reduction of register sizes and a reduction of required ROM memory size in the compression and decompression of data using minimum redundancy codes. The size reduction achieved is in the order of two to one for the implementation of minimum redundancy code formats of 69 codes. The present invention allows much larger code lengths to be processed, since no register is required to be as long as the maximum code length.

An additional object of the invention is to combine both the encoding and decoding functions into the same arrangement of hardware registers and ROM storage. This is possible because decoding involves a regeneration of the size threshold value, which is the same technique utilized to derive the minimum redundancy binary symbols in encoding.

A related object is to increase the flexibility of system application. It is possible to utilize the same hardware arrangement with a simple change in ROM contents. Thus, different code ensembles may utilize with the same hardware configuration. Any smaller code ensemble can always be substituted for a larger one, and the concept can be scaled up easily to expand the code ensemble.

Another object of the invention is to economically provide for the storage of more than one minimum redundancy binary symbol ensemble or format so that the optimum choice of a compression scheme can be made for each image to be prepared. With the elimination for the necessity of creating and storing symbols in advance, the possibility of scanning a document, compressing the data into temporary storage, evaluating the probability statistics, and then creating the optimum minimum redundancy code format for that particular document in real time as it is being transmitted is entirely feasible.

Comprehension of the underlying concepts of the invention and of the particular techniques employed in the implementation thereof may be enhanced by explanation with reference to the accompanying drawings.

DESCRIPTION OF THE DRAWINGS

FIG. 1 is a simple tabulation of binary encoded message characters of known probability of occurrence and corresponding minimum redundancy symbols.

FIG. 2 is a diagram setting forth certain features of the encoding and decoding arrangement of the characters of FIG. 1.

FIGS. 3A 3B and 3C are diagrams useful in explaining the steps in encoding and decoding the characters of FIG. 1.

DETAILED DESCRIPTION

Figure 4:
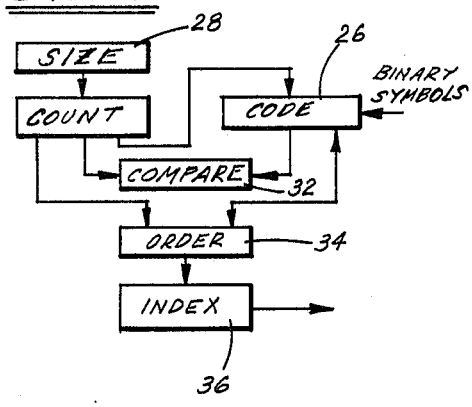
FIG. 4 is a block diagram of an equipment configuration for decoding according to the invention.

The invention lies in the method and apparatus for encoding an decoding binary messages. One possible message ensemble is a format comprising the characters A,D,E,O,S,T,X and sp (indicating a space) depicted in FIGS. 1 and 2. The character messages are orginally present in binary encoded form with a predetermined number bit positions, such as in the three bit position binary form indicated in FIG. 1. The messages are transformed to a minimum redundancy format of variable bit length such as a the Huffman symbol format or code ensemble of FIG. 1, which contains seven different binary symbols of variable bit length. The minimum redundancy binary symbols are arranged to have a minimum possible bit value within the prescribed format. An encoder, such as the encoder of FIG. 6, receives the three bit binary message signals of FIG. 1 and generates and transmits corresponding minimum redundancy binary symbols in stepwise fashion. At least some of the minimum redundancy symbols exceed the storage capacity of the encoder of FIG. 6. Similarly, a decoder, such as the decoder of FIG. 4 receives the minimum redundancy binary symbols of FIG. 1 and regenerates in stepwise fashion portions of ones of the binary symbols in the minimum redundancy binary format of FIG. 1. The decoder of FIG. 4 determines, from the stepwise regenerated portions of symbols and from differences between the regenerated portions and the binary symbols transmitted from the encoder of FIG. 6, the positions in the symbol index of the transmitted binary symbols within the binary symbol format of FIG. 2. The original message can then be reproduced, since its symbol index is already known.

The invention can be most easily explained by way of example. With reference to FIG. 1, characters of a message character set are depicted, each having a unique message symbol of three bits associated therewith. The particular code of the message symbol is not indicative of the probability of occurrence of the character, but a minimum redundancy code which does signify the probability of occurrence of the message signal is associated therewith. The minimum redundancy codes are assigned proceeding from the smallest symbol length and lowest binary value beginning with the most probable character. Accordingly, the symbol "O" of one bit is assigned to the character most likely to occur, which is the space indicated by the letters "sp". The next most likely character to occur is assigned the minimum redundancy symbol "10" and so forth with the least probable character, the letter X, assigned the longest and highest binary value symbol of "111111" in the minimum redundancy code format employed.

FIG. 2 illustrates diagramatically the rank order of probability of occurrence in the column labelled symbol index, as ascertained from the probability table. The symbol size column denotes the number of binary places of which each minimum redundancy binary symbol is composed. As can be seen, there is one binary symbol one bit long, one binary symbol of two bits in length, no binary symbols three bits long, three binary symbols four bits long, one binary symbol five bits long and two binary symbols six bits long. By a simple averaging calculation from the probability table of FIG. 2 one can determine that the average symbol size utilizing the minimum redundancy binary symbol format is 2.43 bits in length, while the average message size is three bits in length. Where large quantities of data are to be transferred, this savings becomes extremely significant both in processing time and in data transmission time.

Figure 6:
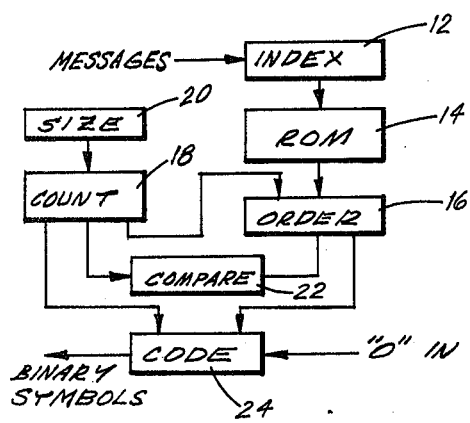
FIG. 6 is a block diagram of an equipment configuration for encoding according to the invention.

FIG. 6 is a block diagram of an encoder which may be used to encode the characters of FIG. 1 from the message symbols to the minimum redundancy binary symbols of FIG. 1. The encoder includes an index register 12 which receives the three bit message signal. The index register 12 addresses the order ROM 14 which contains binary encoded numbers signifying the binary symbol index, or rank order of probability. The contents of ROM 14 are indicated in FIG. 3B. To illustrate, if the message is the character E of FIG. 1, the message symbol in binary encoded form as it arrives at the index register 12 is the binary symbol 010, which digitized is the number 2. This message signal is the address to the ROM 14, indicated in the left hand column of FIG. 3B. Upon receipt of the address 2 in binary encoded form, the ROM 14 reacts by providing as an output the binary indication of the rank order or probability of occurrence of that message. Specifically, the ROM 14 recognizes that the character E has a rank order of probability one (following rank order probability 0). Consequently, since the input is at the third address position, the output of ROM 14 is the binary encoded form of the number 1 or 001. If the character S is the message, the index register 12 addresses the ROM 14 at the sixth address location, which is numbered 5. ROM 14 recognizes that the rank order probability of occurrence of the message S is three. Consequently, ROM 14 provides as an output a binary encoded three, which is the symbol 011.

The output of ROM 14 in FIG. 6 is connected to an order register 16, which receives its initial input from ROM 14, but thereafter for a particular symbol encoding receives all subsequent inputs from the count ROM 18. The count ROM 18 is addressed by the size register 20. The contents of the count ROM are indicated in FIG. 3A. The count ROM is used in both encoding and decoding operations. The count ROM assumes a rank order of probability 0 of the binary symbol to the encoded, and tests for this symbol first. That is, the size register 20 first addresses the count ROM at address location zero, which is the first address location. The count ROM recognizes this address and responds by providing as an output to the order register 16 the count for the symbol size 1, which is 01, indicating that there is one minimum redundancy code having a single bit. As the size register increments, the output of the count ROM will be indicative of the number of different minimum redundancy binary symbols having the bit length specified by the size register. That is, an address of the number 1 to the count ROM is a request for the count ROM to provide an indication of how many minimum redundancy binary symbols which are two bits in length. The count ROM does this by providing the binary number 01, since only the minimum redundancy code for the character E is two bits in length. If the size register is incremented to the number 2, thereby requesting an indication of how many minimum redundancy binary symbols exist which are three bits in length, the count ROM responds with the binary output 00, which indicates that there are no minimum redundancy binary symbols which are three bits in length. The veracity of this response can be readily verified by reference to FIG. 2. As the size register 20 increments, it sequentially produces an output from the count ROM 18 which sequentially defines how many binary symbols of each binary bit length size there are in existence in the minimum redundancy binary symbol format.

The code register 24 also includes an adder which accumulates the aggregate number of minimum redundancy binary symbols specified by the count ROM multiplied by decreasing powers of two. Since the number of these symbols counted progresses from a definition of those symbols having the least number of binary bits to the definition of the number of symbols having the most binary bits, and since the minimum redundancy symbols are arranged so that symbols having the least number of bits are assigned to the most probable message and so that symbols having the most number of bits are assigned to the least probable messages, it can be seen that the count accumulated in the code register 24 is directly related to the determination of rank order probability. The accumulated number in code register 24 is not precisely a designation of priority, but along with bits which may have been shifted out of the register comprises the threshold value of the binary symbol having the lowest binary value which is of a bit length equal to the bit length last specified by the size register 20.

The contents of the order register 16 and the count ROM 18 are compared after each increment of the size register 20 in a comparator 22. The comparator 22 determines whether or not the value in the order register 16 is larger than the value from the count ROM 18. If the value from the ROM 18 fails to exceed that of the order register 16, the count from ROM 18 is added to the code register 24 and subtracted from the order register 16. The size register 20 is thereafter incremented. The code register 24 is shifted with the most significant bit being transferred as part of either the current binary symbol or a previously generated binary symbol and a zero is shifted into the least sigificant bit position of the code register 24. If the contents of the count ROM 18 exceed the value in the order register 16, the value in the order register 16 is added to the contents of the code register 24 and an indication is provided that encoding of the current binary symbol has been completed.

Figure 7:
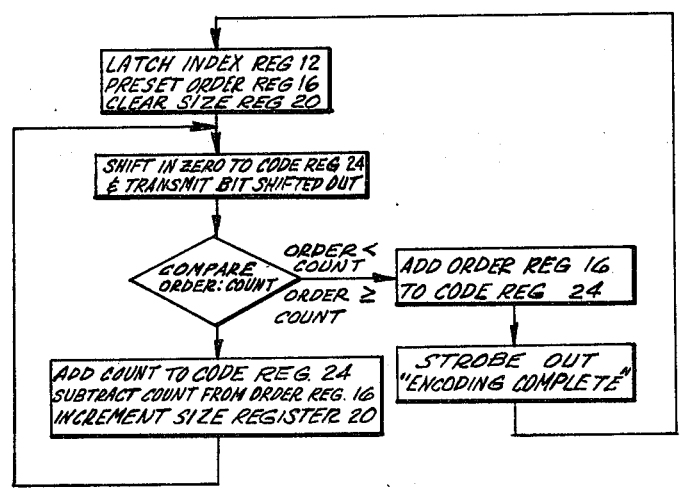
FIG. 7 is a block diagram denoting the steps required in encoding using the equipment of FIG. 6.

The steps in encoding are illustrated diagramatically in FIG. 7, with reference to the components of the encoder of FIG. 6. With reference to FIG. 7, the initial step in the sequence is to latch the index register 12, preset the order register 16 according to FIG. 3B, and clear the size register 20. The system then proceeds to ascertain as a size count value the number of binary permutations of a base level bit length, as designated by the size register 20, in the minimum redundancy binary symbol format. This number or threshold corresponds to the aggregate number of symbols of each symbol size. As these threshold or size count values are generated, they are combined with the code value theretofor existing in the counter 24. With eacy cycle of the system, the sum of all the lower thresholds is multiplied by two by shifting the code register 24 one bit position toward the most significant bit position. It can be seen then that the number of symbols of a bit length of one is multiplied by the greatest power of two $2^n$. The number of symbols of bit length of 2 is multiplied by $2^{n-1}$. The number of symbols of bit length of 3 is multiplied by $2^{n-2}$ and so forth.

The comparison is then performed between the count value in ROM 18 with the rank order of probability of the video or message signal by the comparator 22. The threshold sum in the code register 24 is incremented by the amount of the count value and the rank order value in the order register 16 is decremented by the amount of the count value and the size register 20 is incremented to increment the base level bit length by 1 when the count value in the count ROM 18 fails to exceed the rank order value in the order register 16. The content of the code register 24 is thereafter doubled and the steps of the process iteratively repeated until the count value no longer fails to exceed the rank order value. In this event the remaining binary value in the order register 16 is a residual value over and above the threshold size value sums already generated. This residual value is added to the contents of the code register 24. It should be noted that at this point in time it is entirely possible that the initial portion of the binary symbol generated in the code register 24 has been transmitted and is no longer present in the code register. However, the residual value will always be small enough so that any binary bits carried forward by the process of addition will not carry forward past the fourth place ($\log_2 n$). This is because the minimum redundancy codes are chosen to have minimum values for particular length symbols, with the maximum values being employed as prefixes for longer symbols.

Figure 5:
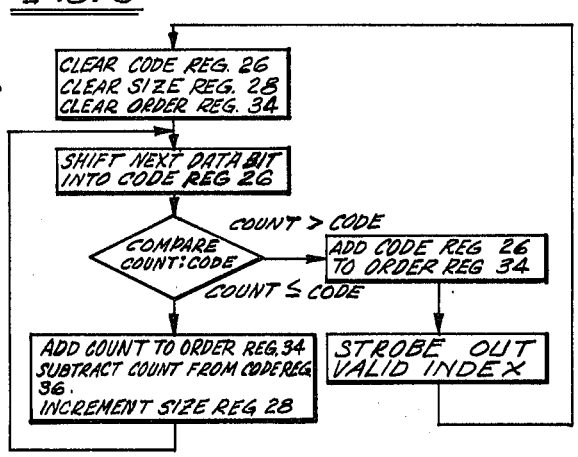
FIG. 5 is a block diagram denoting the steps required in decoding using the equipment of FIG. 4.

A binary symbol generated according to the process depicted in FIG. 7 by the encoder of FIG. 6 may be decoded by the decoder of FIG. 4 and in accordance with the process diagramatically illustrated in FIG. 5. The decoder of FIG. 4 includes a code register 26, a size register 28, a count ROM 30, a comparator 32, an order register 34, and a message index ROM 36. The function of these components closely parallels the function of corresponding components in the encoder of FIG. 6 since the decoding process requires the regeneration of threshold values and the subtraction of these values from the binary symbols as they enter the code register 26.

Figure 9:
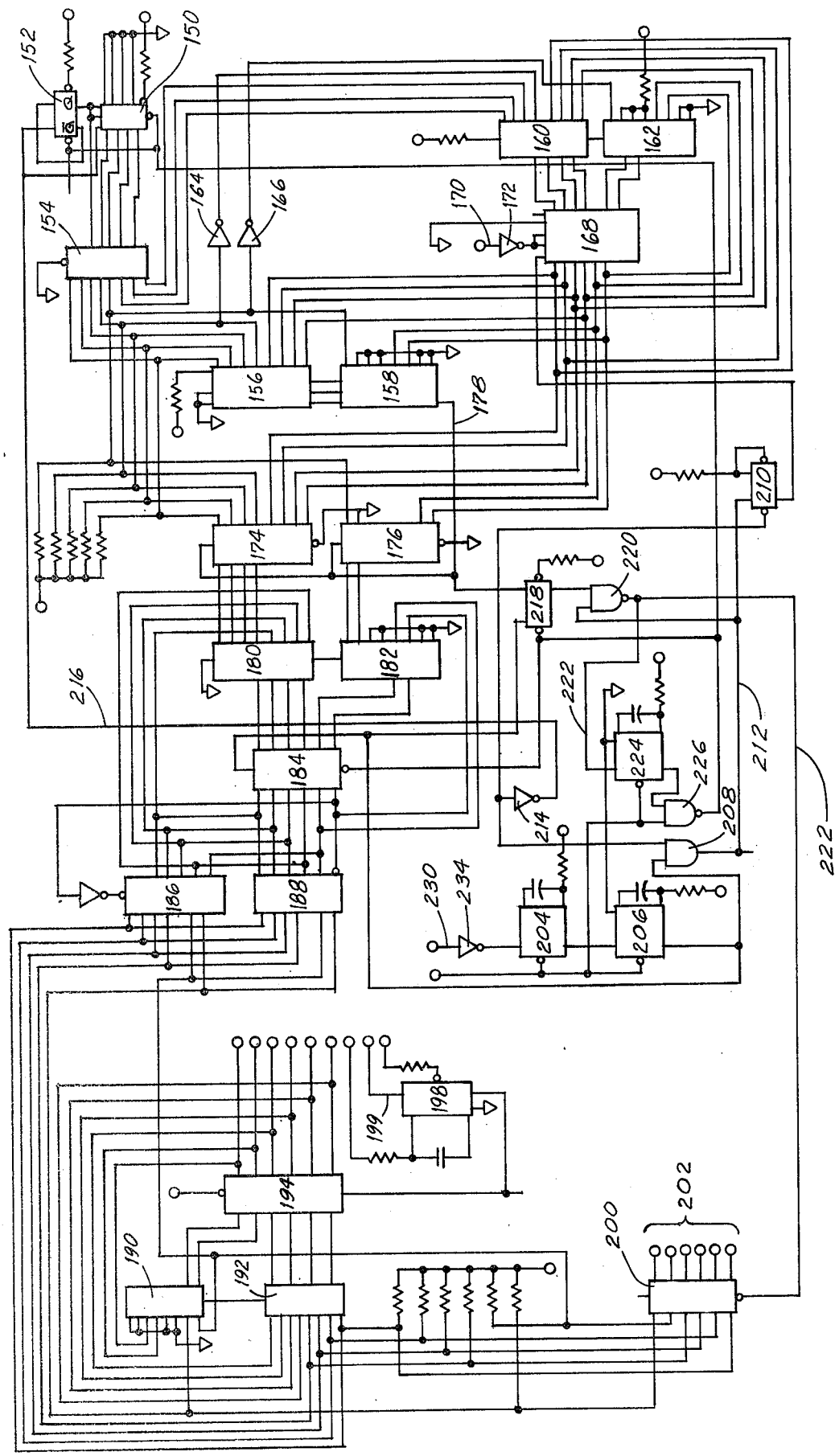
FIG. 9 is a schematic diagram of a decompressor employing a decoder for decoding binary symbols generated by the encoder of FIG. 8.

The code register 26 is a multibit code register for serially receving bits of the binary symbols generated by the encoder of FIG. 6. The code register 26 provides a parallel output to the comparator 32, which also receives an output from the count ROM 30. The operation of the size register 28 and count ROM 30 is directly analogous to the operation of the size register 20 and count ROM 18 in the encoder. That is, the count ROM 30 serves as a threshold generating means for generating threshold symbols indicative of a number of descrete binary symbols of a prescribed bit length within the minimum redundancy format and for providing an output count indicative thereof. The contents of the count ROM 30 are also depicted in FIG. 3A. The size register 28 is a symbol size indicating device connected to the count ROM 30 for prescribing a bit length thereto. The order register 34 is connected to the count ROM 30 and to the code register 26. The comparator 32 is connected to the count ROM 30 and to the code register 26 for comparing the contents thereof and for incrementing the size index register 28, for subtracting the output count of the count ROM 30 from the code register 26 and for adding that count to the order register 34 when the output count of the count ROM 30 fails to exceed the contents of the code register 26. A strobe generating means, hereinafter to be described in connection with FIG. 9 is connected to the code register to thereafter shift the next sequential data bit of a binary symbol into the least significant bit position of the code register 26. A value of the count ROM 30 in excess of the code register 26 as determined by the comparator 32 causes the addition of the contents of the code register 26 to the order register 34, which in turn addresses the index ROM 36 to read out the encoded message. The message contents of the index ROM 36 and the characters associated therewith are depicted in FIG. 3C. The completion of a decoding operation is also indicated to clear the code register 26, the size register 28 and the order register 34 when the output count of the count ROM 30 exceeds the contents of the code register 26.

In carrying out the decoding process, reference to FIG. 5 is useful. Following the clearing of the code register, the size register and the order register, a bit of the next sequential binary symbol is shifted into the code register 26 of the decoder of FIG. 4. The decoder next ascertains as a size count value the number of binary permutations in the minimum redundancy matrix which are of bit length equal to the number of bits of the binary symbol theretofore shifted into the decoder. A comparison is made between the size count value from the count ROM 30 and the value of the bits from the binary symbol remaining in the code register 26. The size count value is added to the order register 34 which contains an accumulation of size count values associated with lesser numbers of bits of the binary symbol to obtain a cumulative order value. The size count value from the count ROM 30 is subtracted from the value of bits from the binary symbol remaining in the code register 26 and the arithmetic steps involved in connection with the shifting and comparison steps are iteratively repeated when the size count value from the count ROM 30 fails to exceed the value of bits from the binary symbol remaining in the code register 26. When the size count value from the count ROM 30 exceeds the value of bits from the binary symbol remaining in the code register 26, however, the value of binary bits from the binary symbol remaining in the code register 26 is added to the cumulative order value in the order register 34. This sum is utilized as an identification of the video signal or message used to generate the binary symbol, and is passed to an index ROM 36 to elicit the original message therefrom. The order register 34, the size register 28 and the code register 26 are then cleared in conjunction with the strobing out of a valid code signal to the index ROM 36.

The code register 26 at each step of the iteration contains the most significant bits of the difference between the binary symbol being received and the threshold value of the binary symbol which is of the bit length specified by the size register 20. This is possible because the threshold value is the aggregate number of symbol counts for each size multiplied by decreasing powers of two and as each symbol count is subtracted from the code register 26, the corresponding power of two factor is the same power of two factor by which the code register contents are offset from the final binary symbol due to symbol bits which have not yet been shifted into the code register. Because of the before mentioned ordered property of the employed minimum redundancy code format, the residual value in the code register 26 will always be non-negative and will never exceed the $\log_2 n$ bit size of the register. When the count value exceeds the code register value, the threshold value for the symbol size of the completed binary symbol will have been subtracted and the remaining binary value in the code register 26 will represent the residual value over and above the cumulative order value generated in the order register 34.

While practical applications of the invention are quite numerous, one particularly useful implementation is in the transmission of video information. In this connection, video information from a raster scanner covering a rectilinear area may be compressed, transmitted, and decompressed according to the present invention. In one implementation of the invention, an aerial scanning camera is used to search the surface of the earth for geographic irregularities associated with oil and mineral deposits. Because the geographic features generally undergo gradual changes, rather than abrupt changes from one incremental area to the next, data accumulated with respect to a particular area location is likely to be similar to data accumulated from previously scanned adjacent locations. The data derived from each area location is sometimes termed a "pixel", and when reproduced, is utilized to form pictures comprised of a multiplicity of individual pixels. In video scanning of geographical areas for surface irregularities, pixel information from one area to the next is likely to be similiar. For this reason, it is advantageous to employ a data compactor for deriving binary messages as signal differential outputs from the pixel source data inputs, so that each message represents a signal difference of one pixel from the next.

Figure 8:
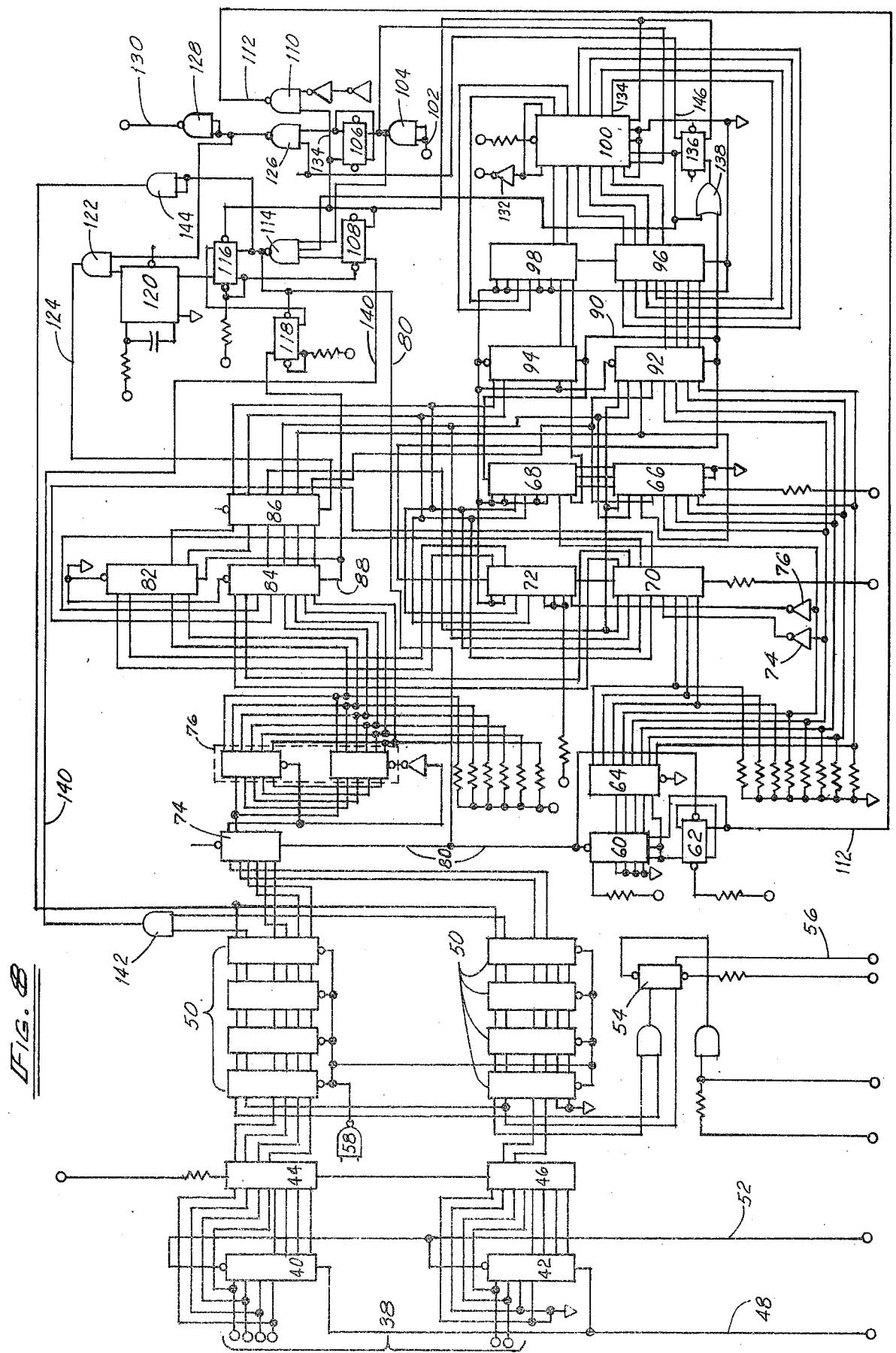
FIG. 8 is a schematic diagram of a compressor employing an encoder constructed according to the invention.

With reference to FIG. 8, data inputs from a video scanner form a six bit digitized video signal indicated on the lines labeled 38. The value of the six bits represents a shade of gray, with the value zero representing black and with the value 63 representing white. The data signals are converted to video message signals in the form of differential message signals between sequentially scanned pixels by a data compactor, comprised of binary latches 40 and 42 and an adder composed of two chips 44 and 46. The data inputs in the form of a video signal on lines 38 are transmitted to the binary latches 40 and 42 and also to one side of the inputs of the four bit adder chips 44 and 46. The outputs of the binary latches 40 and 42 are clocked by a signal on line 48 so that the contents of the latches 40 and 42 from a previous input from lines 38 is passed to the adders 44 and 46 concurrently with the presence of the next subsequent input on lines 38. Only the inverted forms of the outputs of the latches 40 and 42 are passed to the adder chips 44 and 46. In this way the six bit digitized video signal previously stored in latches 40 and 42 is transmitted as a negative input to the adder chips 44 and 46 while the current video signal is transmitted to adder chips 44 and 46 as a positive input. The adder chips 44 and 46 therefor determine the difference between the digitized value of a video signal and the digitized value of the preceding signal and pass this diffential value as a message to a buffer register formed of chips 50. A clear line 52 is provided to clear the latches 40 and 42 at the end of each raster scan of the video scanner.

The buffer is a first in-first out buffer and is used to accomodate temporary storage of message signals to await the acceptance of the signals by the encoder. The encoder processing time will vary depending upon the probability assigned to the particular message being processed. That is, the encoder will require more time to process less probable messages and only a short time to process the more probable messages.

The buffer register chips 50 are arranged to form a six bit parallel shift register, the outputs of which are passed to an encoder. A buffer overflow flip-flop 54 is provided to produce a signal on line 56 to denote a condition in which the buffer chips are unable to accept more data because they are filled to capacity. An AND gate 58 is used to reset the buffer chips upon the occurrence of signals directing the buffers to be cleared and to be reset.

The encoder is located to the right of the buffer chips 50 in FIG. 8. The encoder includes a size register which is formed from a four bit counter chip 60 and a D flip-flop 62. The Q output of the flip-flop 62 is connected to the enable-T lead of the four bit counter 60 so that a five bit size register is formed. The size register is the symbol size counting device and is connected to a threshold generating device which takes the form of a programmed count ROM 64. The contents of the count ROM 64 corresponds to that of the count ROM 18 the contents of which are illustrated in FIG. 3A. The count ROM 64 responds to addresses which requests an output indicating the number of binary symbols of each size by providing this binary value to a pair of four bit comparator chips 66 and 68. It should be noted that only five outputs of the ROM 64 are required to register the threshold signal indicating the number of symbols of the size specified by the size register. These five outputs, as indicated, are passed to the comparator chips 66 and 68. The other three outputs of the ROM 64 are programmed as the inverted forms of the three least significant outputs lines of the ROM 64 which are connected to the comparator chips 66 and 68. These inverted outputs are connected to adder chip 70 which forms half of a pair of adder chips 70 and 72. It is necessary to provide inverters 74 and 76 in association with the other most significant output lines of the ROM 64 which are connected to the comparators 66 and 68 to derive the inverted forms of these lines for connection to the adder chips 70 and 72. It can be seen that the foregoing arrangement provides the entire output of the ROM 64 that is connected to the comparator chips 66 and 68, and in inverted form to the adder chips 70 and 72.

The encoder also includes an index register including a data latch 74 for receiving the entire differential pulse code modulated message from the buffer chips 50 at parallel inputs. The index register data latch 74 is strobed by a message clock signal on line 80 generated at the start of an encoding operation.

An order ROM 76 is connected to the data latch 74 to generate from the message a rank probability signal. That is, the message inputs to the data latch 74 are transmitted as an address to the ROM 76, which provides an output indicating the rank order of probability. In the application described, the highest rank order of probability would be assigned to the message inputs to the data latch 74 indicating a zero differential between adjacent pixel values, since there is the greatest likelihood that the pixel values will not vary one from the next. Ranking second and third in the order of probability are the smallest possible changes between pixel values, plus one and minus one. The message inputs to the data latch 74 are accordingly assigned rank orders of probability so that each message input will elicit a unique output from the ROM 76 indicative of the rank order of probability of that message. The address to the ROM 76 and the output therefrom correspond to the address and output associated with the ROM 14 depicted in FIG. 3B, although of course the ROM 14 provides only 7 possible output values, while the ROM 76 provides 64 possible output values.

The outputs of the order ROM 76 are connected to one side of the inputs of the multiplexer chips 82 and 84 following the clocking in of the message to the index register latch 74. The outputs of the ROM 76 are initially gated through the multiplexer chips 82 and 84 to the order register 86 at the common cement of encoding. Thereafter, however, throughout the remainder of the encoding process for that symbol, the select line 88 to the multiplexer chips 82 and 84 blocks the outputs of the order ROM 76 and instead selects the outputs of the adder chips 70 and 72. The order register 86 thereby receives either the output of the order ROM 76 or the output of the adder chips 70 and 72 as controlled by select line 88.

The adder chips 70 and 72, receive inputs from both the order register 86 and inverted inputs from the count ROM 64. The adder chips 70 and 72 thereby perform the subtraction operation required and pass the difference back to the order register 86.

The comparator chips 66 and 68 compare the outputs of the order register 86 with the outputs of the count ROM 64. If the output from the order register 86 is less than the output of the count ROM 64, the comparator chips 66 and 68 provide a signal on line 90 which is the select line to multiplexer chips 92 and 94. A high signal on line 90 causes the multiplexer chips 92 and 94 to gate through the contents of the order register 86 in preference to the output of the count ROM 64 to adder chips 96 and 98. The adder chips 96 and 98 receive outputs from a code register 100 in which the minimum redundancy binary symbol is generated. The outputs of the code register 100 are added to the outputs from the order register 86 when the select line 90 is actuated, and the sum of addition is returned to the code register 100.

A strobe generating system is provided to coordinate the timing of the various operations and is depicted in the upper righthand portion of FIG. 8. A 5.12 megahertz clock input is provided on lead 102 through a buffer 104 to a flip-flop 106. The flip-flop 106 divides the output in half to provide a 2.56 megahertz signal on line 134. This 2.56 megahertz signal is transmitted to an output ready flip-flop 108 and to a NAND gate 110 which provides a signal output at 112 to the size register to increase the size count of the binary signal to be generated. The output of the output ready flip-flop 108 provides an enable signal to a NAND gate 114, which in turn clocks an encoding complete reset flip-flop 116. The $\overline{Q}$ output of flip-flop 116 clocks an order select flip-flop 118, the Q output of which is the order select line 88. The D input to order select flip-flop 118 is always held high, so that unless reset by the clear signal from NAND gate 114, the select line 88 will always be high and will cause the multiplexer chips 82 and 84 to select the output of the adder chips 70 and 72 in preference to the output of the order ROM 76.

A timing delay circuit is provided to act through an AND gate 122 to provide an order clock signal on output line 124. The other input to AND gate 122 is derived from a NAND gate 126 which receives the divided clock output from flip-flop 106 and the encoding complete status from flip-flop 136. At the output of NAND gate 126 an inverter 128 is provided to produce shift clock pulses on line 130.

The code register 100 is used to parallel load six bits of information and to shift these bits out sequentially through an inverter 132 as the minimum redundancy binary symbols. The shift and load pulses to the code register 100 are provided on the Q output line 134 from the clock divider flip-flop 106. The code register 100 shifts binary symbol bits out through the inverter 132 on the rising edge of the clock pulse when line 134 is high and loads the inputs from the adder chips 96 and 98 on the rising edge of the clock pulse when line 134 is low. A clock inhibit signal is provided to the code register 100 from flip-flop 136 which receives an input through OR gate 138 from line 90 when the contents of the order register 86 fail to exceed the output of the count ROM 64 when the encoding process is completed.

The encoding process is initiated when the output ready signal on line 140 appears from the AND gate 142 at the output of the buffer chips 50 indicating that the buffer has a message to be encoded. When the AND gate 114 is enabled by the message complete signal from the flip-flop 136 and by the clocking pulse from AND gate 104, a shift out pulse from inverter 144 is transmitted to the buffer to cause the next message to be transmitted to the index register data latch 74.

The compressor circuitry depicted in FIG. 8 performs the encoder functions required by the invention according to FIG. 7. That is, the encoding complete signal on line 146 from the $\bar{Q}$ output of flip-flop 136 enables the subsequent encoding process to begin. The clock output from the three input AND gate 114 resets the flip-flop 118 which presets the order register 86 with the output of the order ROM 76. The index register data latch 74 is also strobed on line 80 to load the message from the fifo buffer into the latch 74 and to clear the size register counter 60 and size register flip-flop 62. The clock output of flip-flop 106 on line 134 shifts a zero into the code register 100 and transmits a minimum redundancy binary symbol bit from a previously encoded binary symbol out through an inverter 132.

The comparator chips 66 and 68 compare the contents of the order register 86 with the output of the count ROM 64. If the order register contents are greater than or equal to the count ROM output, the count from the count ROM 64 is gated through the multiplexer chips 92 and 94 and added by adder chips 96 and 98 to the contents of the code register 100 and returned to the code register. Also, the output of the count ROM 64 is substracted from the order register 86 by the adder chips 70 and 72 and returned to the order register. The size register is incremented by the clock output 112 and another zero is shifted into the code register 100 by the shift control signal on line 134. This cycle is repeated until the contents of the order register 86 exceed the output of the count ROM 64, in which case the signal on line 90 from the comparator chips 66 and 68 causes the output of the order register 86 to be gated through the multiplexer chips 92 and 94 to the adders 96 and 98. The adders 96 and 98 then add the contents of the order register 86 to the previously existing contents of the code register 100. The appearance of a signal on line 90 enables the setting of the flip-flop 136 through the OR gate 138 the elicit an encoding complete signal on line 146, whereupon a new message if available from the buffer as denoted by line 140 is loaded into the index register latch 74 and the process is repeated.

It should be noted that the encoder arrangement is such that the messages are arranged in an ordered probability which is unalterable. No provision is made in the basic system of FIG. 8 for examining messages and reordering their probability assignments, although this would be entirely possible.

Messages encoded in the encoder of FIG. 8 may be decoded in the decoder of FIG. 9. The decoder of FIG. 9 is organized in much the same fashion as in the encoder of FIG. 8. A size register including a four bit counter chip 150 and a flip-flop 152 are provided to dictate a size of binary symbol to a count ROM 154. The count ROM 154 provides as an output the binary encoded number of symbols of the size specified and transmits this output to a pair of comparator chips 156 and 158. The contents of the count ROM 154 correspond to the contents of ROM 30 and to the diagram at FIG. 3A. The complement of the output of ROM 154 is connected to adder chips 160 and 162 utilizing inverters 164 and 166 and inverted outputs from ROM 154 in the same manner explained in connection with the count ROM 64 in FIG. 8. The adders 160 and 162 are connected to the inputs of a code register 168 which receives the data stream of minimum redundancy binary symbols on line 170 through an inverter 172.

The outputs of the count ROM 154 are also connected to multiplexer chips 174 and 176, which receive alternative inputs from the code register 168. Selection by the multiplexer chips 174 and 176 of either the contents of the code register 168 or the output of the count ROM 154 is determined by the state of the select line 178 from the comparator chips 156 and 158. The output of the multiplexer chips 174 and 176 is passed to adder chips 180 and 182. The sum lines of the adder chips 180 and 182 are connected to the inputs of an order register 184. The outputs of the order register 184 are looped back to the adder chips 180 and 182 and are also connected to a message index ROM formed of two chips 186 and 188. The output of message index ROM chips 186 and 188 represents the reconstructed message, which is the six bit code indicative of differences in sequential pixel values. The contents of message index ROM chips 186 and 188 corresponds to the contents of index ROM 36 of FIG. 4, which are depicted in FIG. 3C. The message outputs from the message index ROM chips 186 and 188 are connected to adder chips 190 and 192 as one set of inputs. The other set of inputs to the adder chips 190 and 192 is derived from the outputs of an accumulator 194. The function of the accumulator 194 is to accumulate the difference messages from the message index ROM chips 186 and 188 and to provide the actual pixel data on the six output lines indicated collectively at 196.

A 100 nanosecond delay circuit 198 is provided with a clocking output at 199 which indicates when the pixel data on output lines 196 has stabilized and is available for utilization. A register 200 is provided for test purposes to allow the messages from the message index ROM chips 186 and 188 to appear for sampling as they emerge from the decoder at differential output lines 202.

Timing circuitry is provided in association with the decoder of FIG. 10 and includes two cascaded delay circuits 204 and 206. The output of delay circuit 206 is provided to an AND gate 208 which provides a shift register clock pulse to the shift load flip-flop 210. The D input of the flip-flop 210 is held in a high condition to provide shift and load pulses to the code register 168 when clocked at input 212. The data shift clock input to delay circuit 204 is passed through an inverter 214 to provide a signal to increment the size register on line 216. The signal on line 178 which occurs near the end of the decoding cycle when the output of the count ROM 154 exceeds the contents of the code register 168 is provided to a flip-flop 218 to provide a valid index pulse to a NAND gate 220 which in turn emits a valid index strobe on line 222. Strobe line 222 latches the pixel differential signal into the accumulator 194 and into test register 200 and the delay circuit 190 is activated to notifiy the system when a message has been decoded and to allow it to be tabulated. The strobe line 222 also triggers a delay circuit 224 which acts through a NAND gate 226 to provide a signal clearing the order register 184, the size register 150 and 152, the code register 168 and resetting the flip-flop 218.

The functional operation of the decoder circuitry follows the process depicted in FIG. 5. The valid index strobe on line 222 causes the output of the NAND gate 226 to clear the order register 184, the code register 168 and the size register 150 and 152. The data shift clock signal on line 230 acts through an inverter 234 through the flip-flop 210 to shift the next data bit on line 170 into the code register 168. The comparator chips 156 and 158 compare the contents of the code register 168 with the output of the count ROM 154. If the output of the count ROM 154 fails to exceed the code register contents, the select line 178 remains inactive so that the output of the count ROM 154 is transferred to the adders 180 and 182. In the adders 180 and 182, the output of the count ROM 154 is added to the output of the order register 184 and the sum is returned to the order register 184.

The signal on data shift clock 230 also produces a signal on line 216 which increments the size register and resets the flip-flop 210. The data shift clock acting on line 230 produces a signal on line 212 to again shift the next data bit from line 170 into the code register 168.

If the output of the comparators 156 and 158 shows that the count ROM output is greater than the contents of of the code register 168, the contents of the code register 168 are gated through the multiplexer chips 174 and 176 and are added to the contents of the order register 184 in adders 180 and 182. The sum is returned to order register 184. With the occurrence of the next valid index strobe on line 222, the accumulator 194 is gated to take the contents of the adders 190 and 192, which always receive the data message at one set of inputs, from the message index ROM chips 186 and 188. In this way pixel message signal information is provided at the outputs 196 of accumulator 194.

While the general and specific embodiments depicted in the drawings herein have been provided for exemplary purposes, it should be understood that there are numerous variations and modifications to the invention which will become readily apparent to those skilled in the art. Accordingly, the invention should not be considered as limited to the specific implementations disclosed in connection with the drawings hereof, but rather is defined in the claims appended hereto.

We claim:

1. A method transferring image information from a video scanner which produces video signals having a predetermined number of bit positions and corresponding to levels of contrast of image information utilizing an encoder and a decoder comprising:

assigning each permutation of bit arrangement of said video signals a rank order of probability, encoding each of said video signals by generating in association therewith a binary symbol of variable length according to the rank order of probability of occurrence of the video signal associated therewith from a symbol format of minimum redundancy by generating a threshold value which is the cumulation of numbers of symbols of each smaller bit length multiplied by decreasing powers of two with increasing bit length and by generating a residual value indicative of a relative position of probability within symbols of like bit length, serially communicating said binary symbols to said decoder, decoding each of said encoded binary symbols by regenerating the threshold prefix value in said decoder for each encoded binary symbol, subtracting said threshold prefix value therefrom to isolate the associated residual value, and calculating the threshold order of probability of binary signals of like symbol length from said regenerated threshold, and combining said threshold order of probability with said residual value to identify the video signal used to generate said binary symbol.

2. The method according to claim 1 wherein said encoding of each video signal further comprises:

(a) ascertaining as a size count value the number of binary permutations of a base level bit length in said minimum redundancy binary symbol format, (b) additively combining said size count value with a code value to obtain an updated code value, (c) comparing said size count value with the rank order of probability of said video signal (d) decrementing said rank order by the amount of said count value, incrementing said base level bit length by one, doubling said updated code value, and iteratively repeating steps (a) through (d) when said size count value fails to exceed said rank order, and (e) additively combining said rank order with said code value as a binary symbol when said size count value does not fail to exceed said rank order.

3. The method according to claim 1 wherein said encoder includes an order register, order storage means, a size register, code shift register means, and a count storage means further comprising:

(a) addressing said order storage means with said video signal to provide a rank order number of probability of occurrence of said video signal in an order register, (b) clearing said size register, (c) shifting said code shift register means to enter a zero in the least significant bit position thereof and transmit the most significant bit therefrom, (d) addressing said count storage means with said size register to provide a total of binary symbols of bit length of said size register, (e) comparing the output of said count storage means with the contents of said order register, (f) adding the outputs of said count storage means to said code shifts register means, substracting the contents of said count storage means from said order register and incrementing the contents of said size register by one and interatively repeating steps (c) through (e) when the output of said count storage means fails to exceed the contents of said order register, (g) addin the contents of said order register to the contents of said code shift register means, and interatively repeating steps (a) through (g), and (h) signaling the completion of a binary symbol when the output of said count storage means does not fail to exceed the contents of said order register.

4. The method according to claim 1 wherein said decoding of each video signal further comprises:

(a) shifting a bit of a binary symbol into said decoder, (b) ascertaining as a size count value the number of binary permutations in said minimum redundancy symbol matrix of bit length equal to the number of bits of said binary symbol theretofor shifted into said decoder, (c) comparing said size count value with the value of bits from said binary symbol remaining in said decoder, (d) adding said size count value to an accumulation of size count values associated with lesser numbers of bits of said binary symbol to obtain a cumulative threshold value, substracting said size count value from the value of bits from said binary symbol remaining in said decoder, and iteratively repeating steps (a) through (d) when said size count value fails to exceed the value of bits from said binary symbol remaining in said decoder, and (e) adding said cumulative threshold value to said value of bits from said binary symbol remaining in said decoder and utilizing the sum as an identification of the video signal used to generate said binary symbol, and reducing to zero said threshold values and said value of bits from said binary symbol remaining in said decoder when said size count value exceeds said value of bits from said binary symbol remaining in said decoder.

5. The method according to claim 1 wherein said decoder includes a size register, a count storage means, a code register, an order register and an index storage means further comprising:

(a) shifting a bit of a binary symbol into said code register, (b) ascertaining as a size count value from the count storage means to the number of binary permutations in said minimum redundancy symbol matrix of bit length equal to the number of bits of said binary symbol theretofor shifted into said code register, (c) comparing said size count value from the count storage means with the binary value in said code register, (d) adding said size count value to said order register, substracting said size count value from the binary value in said code register, and iteratively repeating steps (a) through (b) when said size count value fails to exceed the bit value remaining in said code register, and (e) adding the contents of said order register to the contents of said code register and utilizing the sum in the index storage means as an identification of the video signal used to generate said binary symbol, and clearing said code register and said order register when said size count value exeeds the bit value remaining in said code register.

6. Apparatus for encoding binary messages from a message format having a predetermined number of bit positions to binary symbols selected from a minimum redundancy format of variable bit length and arranged with said binary symbols having a minimum possible bit value within said format and for decoding said encoded messages comprising:

encoding means for receiving said messages and for generating and transmitting in steps said binary symbols at least some of which exceed the storage capacity thereof, decoding means for receiving said binary symbols and for stepwise regenerating portions of ones of said binary symbols in said minimum redundancy format, at least some of which symbols exceed the storage capability thereof, and for determining from said stepwise regenerated portions and from differences between said regenerated portions and said binary symbols transmitted from said encoder the positions of said trasmitted binary symbols within said minimum redundancy format.

7. Apparatus according to claim 6 further comprising:

data compacter means for deriving said binary messages as signal differential outputs from source data inputs, whereby each message represents a signal difference.

8. Apparatus according to claim 7 further comprising buffer storage means interposed between said data compacter means and encoding means for regulating the flow of differential outputs from said compacter to said encoding means.

9. Apparatus for encoding binary messages from a message format having a predetermined number of bit positions to binary symbols from a minimum redundancy format of variable bit length and arranged with said binary symbols having a minimum possible bit value within said format comprising:

index register means for receiving said entire message and for generating from said message a rank probability order signal, order register means for receiving said rank probability order signal, threshold generating means for generating threshold signals indicative of the number of discrete binary symbols of a prescribed bit length within said minimum redundancy format and for providing an output count indicative thereof, symbol size counting means connected to said threshold generating means for prescribing said bit length thereto, multiple bit code register means for serially generating said binary symbols bit by bit and for sequentially transmitting bits thereof from the most significant to the least significant bit, comparator means connected to said threshold generating means and to said order register means for comparing the contents thereof and for incrementing said symbol size counting means, substracting said output count from said order register means and adding said output count to said code register means when said output count fails to exceed the contents of said order register means, and for adding the contents of said order register means to said code register means, signaling the completion of a binary symbol, and clearing said symbol size counting means and enabling said index register means to receive another message when said output count exceeds the contents of said order register means, and strobe generating means connected to said code register means to shift a zero into the least significant bit position and to shift out the most significant bit thereof following subtraction of said output count from said order register means and addition to said output count to said code register means when said output count fails to exceed the contents of said order register means.

10. Apparatus according to claim 9 further characterized in that said code register means employs four bit positions.

11. Apparatus according to claim 9 further characterized in that said index register means and said size counting means each employ five bit positions.

12. Apparatus for decoding binary symbols of variable bit length selected from a minimum redundancy format arranged with said binary symbols having a minimum possible bit value within said format to a message format having a predetermined number of bit positions comprising:

multibit code register means for serially receiving bits of said binary symbols and for providing a parallel output therefrom, threshold generating means for generating threshold signals indicative of the number of discrete binary symbols of a prescribed bit length within said minimum redundancy format and for providing an output count indicative thereof, symbol size counting means connected to said threshold generating means for prescribing bit length thereto, order register means connected to said threshold generating means, and to said code register means, comparator means connected to said threshold generating means and to said code register means for comparing the contents thereof and for incrementing said symbol size counting means, substracting said output count from said code register means and adding said output count to said order register means when said output count fails to exceed the contents of said code register means, and for adding the contents of said code register means to said order register means and for indicating the completion of a decoding operation to clear said code register means, said symbol size counting means and said order register means when said output count exceeds the contents of said code register means, strobe generating means connected to said code register means to shift the next sequential data bit of a binary symbol into the least significant bit position of said code register means when said output count fails to exceed the contents of said code register means.

13. Apparatus according to claim 12 further characterized in that said code register means employs four bit positions.

14. Apparatus according to claim 12 further characterized in that said index register means and said size counting means each employ five bit positions.

* * * * *